United States Patent
Chen et al.

(10) Patent No.: US 8,865,539 B2
(45) Date of Patent: Oct. 21, 2014

(54) FULLY DEPLETED SOI MULTIPLE THRESHOLD VOLTAGE APPLICATION

(75) Inventors: Hao-Yu Chen, Kaohsiung (TW); Chang-Yun Chang, Taipei (TW); Di-Hong Lee, Austin, TX (US); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 109 days.

(21) Appl. No.: 13/100,673

(22) Filed: May 4, 2011

(65) Prior Publication Data
US 2011/0212579 A1 Sep. 1, 2011

Related U.S. Application Data

(63) Continuation of application No. 12/110,005, filed on Apr. 25, 2008, now abandoned, which is a continuation of application No. 11/093,593, filed on Mar. 29, 2005, now Pat. No. 7,382,023.

(60) Provisional application No. 60/566,040, filed on Apr. 28, 2004.

(51) Int. Cl.
| | |
|---|---|
| *H01L 21/8238* | (2006.01) |
| *H01L 29/786* | (2006.01) |
| *H01L 21/84* | (2006.01) |
| *H01L 21/762* | (2006.01) |
| *H01L 27/12* | (2006.01) |

(52) U.S. Cl.
CPC .......... *H01L 29/78603* (2013.01); *H01L 21/84* (2013.01); *H01L 21/76267* (2013.01); *H01L 21/76283* (2013.01); *H01L 27/1203* (2013.01)

USPC .......................................... 438/218

(58) Field of Classification Search
USPC .......................................... 438/218
See application file for complete search history.

(56) References Cited

U.S. PATENT DOCUMENTS

| | | | |
|---|---|---|---|
| 5,279,978 A | 1/1994 | See et al. | |
| 5,895,252 A * | 4/1999 | Lur et al. | 438/423 |
| 5,940,691 A * | 8/1999 | Manning | 438/151 |
| 6,020,610 A | 2/2000 | Ueno et al. | |
| 6,171,910 B1 | 1/2001 | Hobbs et al. | |
| 6,180,487 B1 | 1/2001 | Lin | |
| 6,252,281 B1 | 6/2001 | Yamamoto et al. | |
| 6,326,247 B1 | 12/2001 | Krishnan et al. | |
| 6,339,232 B1 | 1/2002 | Takagi | |

(Continued)

FOREIGN PATENT DOCUMENTS

EP  1 193 754 A2  4/2002

OTHER PUBLICATIONS

Li, X., et al., "Threshold Voltage Control for Deep Sub-micrometer Fully Depleted SOI MOSFET," IEEE (2003) pp. 284-287.

(Continued)

*Primary Examiner* — Benjamin Sandvik
(74) *Attorney, Agent, or Firm* — Slater & Matsil, L.L.P.

(57) ABSTRACT

An integrated circuit comprises a substrate and a buried dielectric formed in the substrate. The buried dielectric has a first thickness in a first region, a second buried dielectric thickness in a second region, and a step between the first and second regions. A semiconductor layer overlies the buried dielectric.

20 Claims, 9 Drawing Sheets

(56) References Cited

U.S. PATENT DOCUMENTS

| | | |
|---|---|---|
| 6,414,355 B1 | 7/2002 | An et al. |
| 6,424,016 B1 | 7/2002 | Houston |
| 6,448,114 B1 * | 9/2002 | An et al. ............ 438/142 |
| 6,501,135 B1 | 12/2002 | Krivokapic |
| 6,737,332 B1 * | 5/2004 | Fuselier et al. ............ 438/423 |
| 2001/0028089 A1 | 10/2001 | Adan |
| 2002/0086491 A1 | 7/2002 | Kizilyalli et al. |
| 2003/0119292 A1 | 6/2003 | Lee et al. |
| 2003/0148586 A1 | 8/2003 | Izumi et al. |
| 2004/0094809 A1 | 5/2004 | Frank et al. |
| 2005/0127417 A1 * | 6/2005 | Saenger et al. ............ 257/295 |

OTHER PUBLICATIONS

Polishchuk, I., et al., "Dual Work Function Metal Gate CMOS Transistors by Ni-Ti Interdiffusion," IEEE Electron Device Letters, vol. 23, No. 4 (Apr. 2002) pp. 200-202.

Wakabayashi, H., et al., "A Novel W/TiNx Gate CMOS Technology using Nitrogen-Concentration-Controlled TiNx Film," IEEE Electron Device Meeting (1999) pp. 253-256.

* cited by examiner

FULLY DEPLETED SOI MULTIPLE THRESHOLD VOLTAGE APPLICATION

This application is a continuation of and claims the benefit of patent application Ser. No. 12/110,005, entitled "Fully Depleted SOI Multiple Threshold Voltage Applications," filed on Apr. 25, 2008, which application is a continuation of and claims the benefit of patent application Ser. No. 11/093,593, entitled "Fully Depleted SOI Multiple Threshold Voltage Application," filed on Mar. 29, 2005, now U.S. Pat. No. 7,382,023, which claims the benefit of U.S. Provisional Application No. 60/566,040, filed on Apr. 28, 2004, entitled "Fully Depleted SOI Multiple Threshold Voltage Application," all of which applications are hereby incorporated herein by reference.

TECHNICAL FIELD

The present invention relates generally to semiconductor devices, and more particularly to a system and method for a fully depleted SOI multiple threshold voltage application.

BACKGROUND

In order to produce competitive electronic devices, it is often desired to produce semiconductor chips with several different regions (e.g., core region, low power region, I/O region) having semiconductor devices that vary according to speed and power, for example. Semiconductor devices that provide some or all of these features include silicon-on-insulator (SOI) devices. An existing challenge in SOI technology, however, is forming thin Si channel SOI I/O devices with significant voltage threshold ($V_{th}$) control. For example, in an SOI I/O application, a higher $V_{th}$ is necessary because SOI devices suffer from a larger drain induced barrier lowering (DIBL) effect (which is caused by the floating body characteristics) than do bulk silicon wafer devices. Further, the higher voltages typically applied in the I/O regions increase the concern regarding leakage current. Overcoming these shortcomings will become increasingly significant as SOI device thickness is scaled down to improve performance and to reduce the floating body effects.

Several known methods attempt to control $V_{th}$ by controlling the body potential of the SOI transistor. A first method is to tie the transistor body to a fixed voltage level through a substrate contact. However, despite reducing the floating body effect (FBE) in SOI devices, the body-tied method may suffer from area and speed penalties. In addition, the benefits obtained by the body-tied method may diminish as SOI silicon thicknesses scale downward because the increasing body resistance will make the body contact useless.

Another known body method for controlling $V_{th}$ is channel region doping. Despite raising the $V_{th}$, however, channel implants reduce the depletion ability of an SOI device, thereby incurring performance degradation from the FBE.

Another commonly used method for FBE reduction is to fully deplete (FD) the channel region of the SOI device by thinning the silicon thickness. The FD SOI device enables an additional impact ionization (I-I) induced carrier sweep out of the channel, thereby suppressing the FBE. Substantial suppression of the FBE in the transistor channel region significantly enhances voltage threshold control.

Biasing the body region of an SOI transistor is conventionally an important part of device $V_{th}$ control, and thinning the silicon body thickness has become a preferred method that contributes to $V_{th}$ control. However, there is still a need for SOI technology with the capacity to provide sufficient back gate bias to achieve desired $V_{th}$ values.

Another known and accepted method of achieving a desired $V_{th}$ is to modify the gate electrode work function by modifying the material composition of the gate electrode. FIGS. 1a and 1b show known devices 100 and 102, in which the gate electrode 104 material composition, and correspondingly the gate electrode 104 work function, is varied to control the voltage threshold of the devices. The CMOS structure 100 shown in FIG. 1a is disclosed by Polishchuk, et al. in a paper entitled "Dual Work Function Metal Gate CMOS Transistors by Ni—Ti Interdiffusion," IEEE Electron Device Letters, Vol. 23, No. 4, April 2002, incorporated herein by reference. FIG. 1a shows a gate electrode 104 comprising nickel and titanium over the PMOS region 106 and comprising titanium over the NMOS region 108.

The FD SOI transistors 102 shown in FIG. 1b and disclosed by H. Wakabayashi in a paper entitled "A Novel W/TiNx Metal Gate CMOS Technology Using Nitrogen-Concentration-Controlled TiNx Film," IEEE IEDM, December 1999, which paper is incorporated by reference herein, have gate electrode 104 material compositions of tungsten W, titanium Ti, a first concentration of nitrogen N and a second concentration of nitrogen $N_x$. The variation of material composition varies the gate work function of each gate electrode 104, thereby varying the voltage threshold of the FD SOI transistors 102.

FIGS. 1a and 1b show gate electrode material composition variation within a small region of the chip. It is difficult, however, to apply different gate work function materials for SOI core applications and I/O device applications on the same chip, for example. In the conventional circuit application, the threshold voltage for a 3.3 eV I/O device is about 0.65 eV and the threshold voltage for a 1.0 eV core device is about 0.2 eV. The target threshold voltages are achieved by using a well or a pocket implantation in the bulk substrate. However, for a fully-depleted SOI device, the threshold voltage cannot be adjusted by the channel or pocket implantation because heavy substrate concentration will turn the FD device into a partially depleted device and degrade the performance. One method to achieve a different threshold voltage for a fully depleted SOI device is to change the gate work function. This can be demonstrated with reference to the following formula:

$$Vth = \underbrace{\left[\Phi_{ms} - \frac{Q_f}{C_{ox}}\right]}_{V_{FB}} + \Phi_s + \frac{\sqrt{2\varepsilon q N_{A(D)} \Phi_s}}{C_{ox}}$$

For example, if we keep the Na (substrate concentration) constant, we may need another variable to control the threshold voltage to a desired value in a different application. The gate workfunction ($\Phi m$) is a good candidate for $V_{th}$ tuning because recently metal gate development has become mainstream technology. This is because metal gates not only improve gate resistance, but they also show better characteristics, compared to polysilicon, in integrating with high-k dielectric materials, as illustrated in FIG. 1c.

SUMMARY OF THE INVENTION

These and other problems are generally solved or circumvented, and technical advantages are generally achieved, by preferred embodiments of the present invention, which provide for a fully depleted SOI multiple threshold voltage application. In other embodiments, the present invention provides for an integrated circuit having fully depleted SOI multiple threshold voltage devices and non-SOI multiple threshold voltage devices.

In accordance with an illustrative embodiment of the present invention, an integrated circuit comprises a substrate and a buried dielectric formed in said substrate. The buried dielectric has a first thickness in a first region, a second buried dielectric thickness in a second region, and a step between said first and second regions. A semiconductor layer overlies said buried dielectric.

In accordance with another illustrative embodiment of the present invention, a semiconductor chip (also known as a die) has a first region and a second region. The semiconductor chip also has a substrate and a semiconductor layer overlying the substrate. The semiconductor chip further comprises a buried dielectric under the semiconductor layer formed at least partially in said substrate. The buried dielectric has a first thickness in said first region and a second thickness in said second region separated by a step. A first transistor has a first gate electrode and a second transistor has a second gate electrode formed in said first region. A third transistor has a third gate electrode and a fourth transistor has a fourth gate electrode formed in said second region.

In accordance with another illustrative embodiment of the present invention, a semiconductor chip comprises a substrate. The substrate comprises at least one buried dielectric, the buried dielectric having a first buried dielectric thickness in a first $V_{th}$ region greater than a second buried dielectric thickness in a second $V_{th}$ region, wherein the difference between the first $V_{th}$ and the second $V_{th}$ is about 0.15~0.45 eV. Specific examples would include a core region having a $V_{th}$ of about 0.2 eV (less than 1.8 eV) and an I/O region having a $V_{th}$ of about 0.65 eV, wherein the barrier dielectric thickness of the core region is greater than the barrier dielectric thickness of the I/O region. For other applications, the threshold voltage of the I/O region may be greater than 1.8 eV.

In accordance with another illustrative embodiment of the present invention, a semiconductor chip comprises a substrate. The substrate comprises at least one buried dielectric, the buried dielectric having a first buried dielectric thickness in a core region greater than a second buried dielectric thickness in an I/O region. The chip also comprises a first fully depleted silicon on insulator p-channel metal oxide semiconductor (FD SOI PMOS) transistor in the core region, the first FD SOI PMOS transistor with a first gate electrode overlying a first gate dielectric, the first gate electrode having a first work function. The semiconductor chip further comprises a first FD SOI n-channel metal oxide semiconductor (NMOS) transistor in the core region, the first FD SOI NMOS transistor with a second gate electrode overlying a second gate dielectric, the second gate electrode having a second work function. The semiconductor chip further comprises a second FD SOI PMOS transistor in the input/output (I/O) region, the second FD SOI PMOS transistor with a third gate electrode overlying a third gate dielectric, the third gate electrode having a third work function. The semiconductor chip still further comprises a second FD SOI NMOS transistor in the input/output region, the second FD SOI NMOS transistor with a fourth gate electrode overlying a fourth gate dielectric, the fourth gate electrode having a fourth work function. The first, second, third and fourth work functions are substantially different from one another.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a fully depleted SOI multiple threshold voltage application. The invention may also be applied, however, to other semiconductor devices and semiconductor applications having a need for multiple threshold voltages on the same substrate.

Figure 1A:
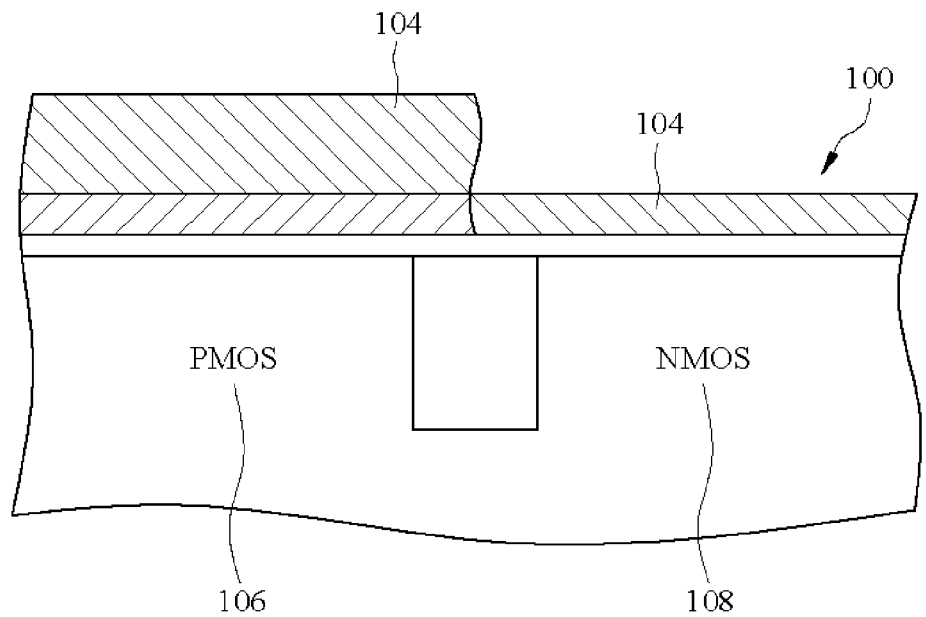
FIGS. 1a and 1b show known dual work function metal gate transistors.
Figure 1B:
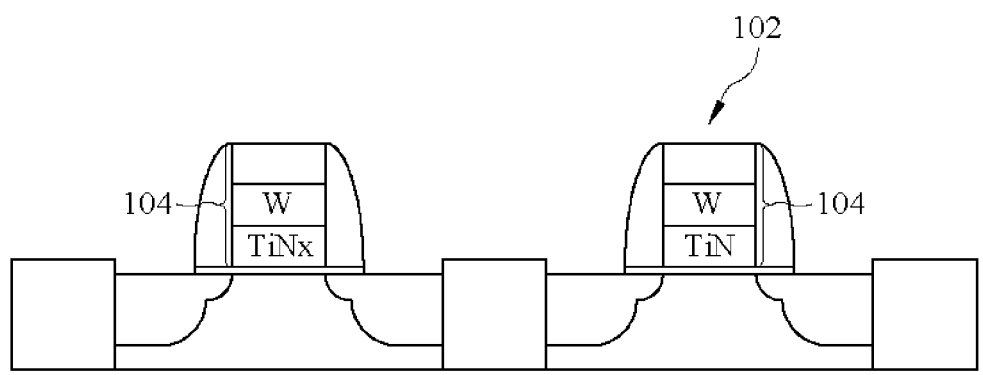
Figure 1C:
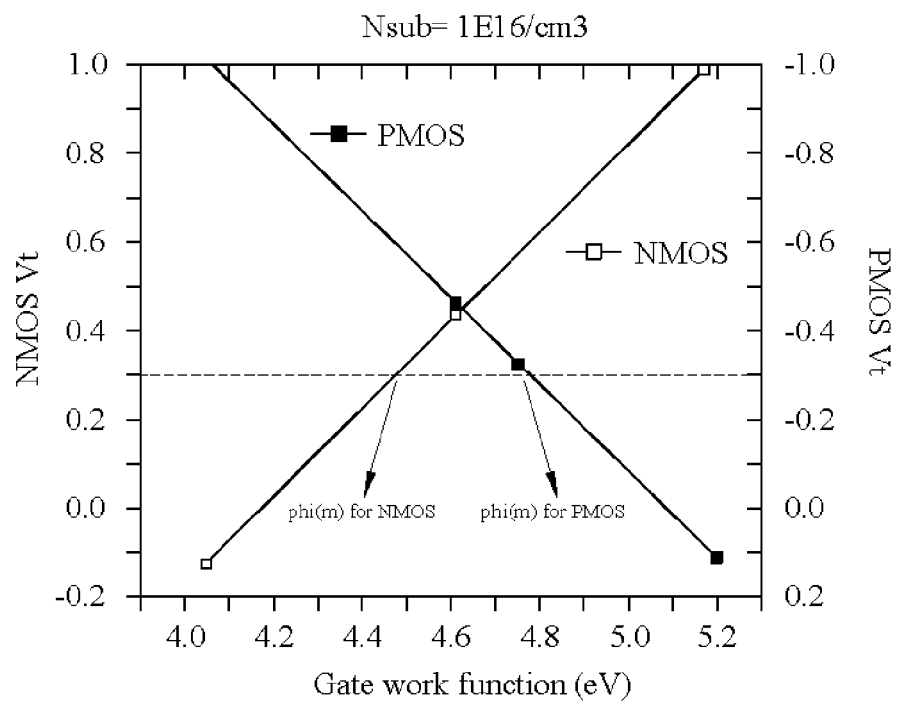
FIG. 1c graphically illustrates the relationship between threshold voltage and gate work function.
Figure 2A:
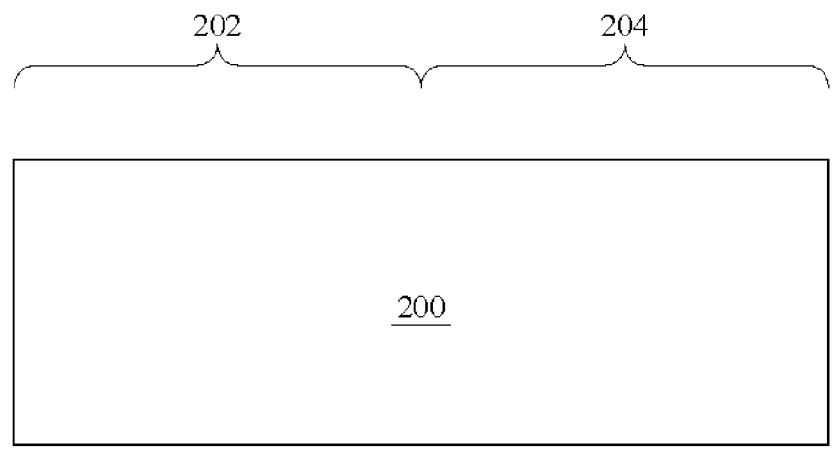
FIGS. 2a-2c show cross-sectional views demonstrating steps in a first method of manufacturing in accordance with a first illustrative embodiment of the present invention.

A substrate 200, shown in FIG. 2a, comprises a semiconductor substrate material. The substrate material is preferably a p-type doped substantially crystalline silicon material with a crystal orientation of <100>. Alternatively, the substrate 200 may be doped n-type and have a crystal orientation the same as the p-type doped substrate, or other crystal orientations such as <111> and <110>, for example. The substrate 200 may comprise any material suitable as a semiconductor substrate, such as gallium arsenide, indium phosphide, silicon, germanium, carbon, and combinations thereof, including buffer layers comprising graded proportions of semiconductor materials such as a graded silicon germanium buffer layer, for example. The substrate 200 may also be a strained semiconductor such as strained silicon or ceramic wafer, for example.

The substrate 200 has a core region 202 and an input/output (I/O) region 204. Illustrative embodiments of the present invention include substrates with any number of regions having any number of voltage threshold requirements. For example, illustrative embodiments include substrates with regions designated for low noise applications. Transistors formed in I/O regions of semiconductor chips typically have a higher threshold voltage than transistors in the core regions of the same chip, for example.

Examples of I/O devices may include tri-state buffers, input buffers, and output buffers, for example. I/O devices may include electrostatic discharge (ESD) circuitry and may provide a tolerance to multiple voltages. I/O regions, such as the I/O region 204, are typically formed on the outskirts of a chip, in parts remote from the center. Core regions, such as the core region 202, are typically located in regions of a chip that are proximate the center. Other arrangements of the I/O and core regions are contemplated, however. Core regions 202 typically include transistors having high speed and low power requirements for large scale integrated (LSI) circuits (e.g., ULSI, VLSI), such as processors, controllers, and application specific integrated circuits (ASICs), for example.

Figure 2B:
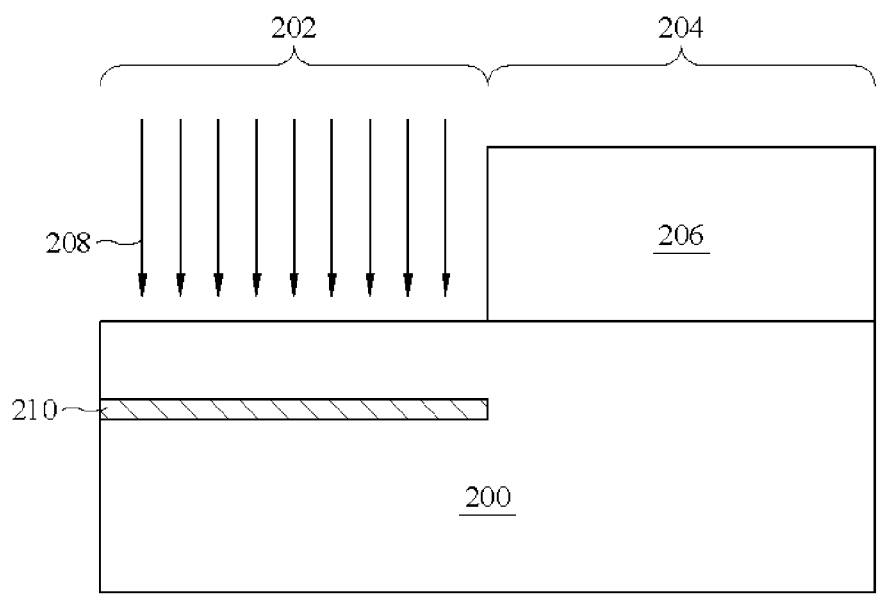

Referring to FIG. 2b, a mask 206 is deposited over the I/O region 204 of the substrate 200, exposing the core region 202 of the substrate 200. The substrate 200 is subjected to implantation of a dielectric material 208 into exposed portions of the silicon substrate 200, forming a buried dielectric 210. The implantation process is preferably an oxygen implant process, such as separation by implanted oxygen (SIMOX). The implantation process may alternatively be separation by implanted nitrogen (SIMNI), separation by implanted oxygen and nitrogen, or internal thermal oxidation (ITOX), for example. The SIMOX implantation step preferably includes ion implantation of oxygen (e.g., $1.8 \times 10^{18}$ per $cm^2$) with substrate temperatures greater than about 600 degrees Celsius.

The implantation of other materials such as nitrogen and hydrogen may be performed concurrently or subsequently. For example, the buried dielectric 210 may be a nitrided oxide or a hydrogenated oxide composite of silicon oxide. Implanting nitrided oxide contributes to the prevention of impurity dopant diffusion into the buried oxide, thereby preventing device performance degradation. Impurity dopant diffusion may occur from impurity dopants implanted during a well formation manufacturing step, such as for n-type wells (n wells), for example. As another example, carbon may be implanted to form a carbide layer.

Figure 2C:
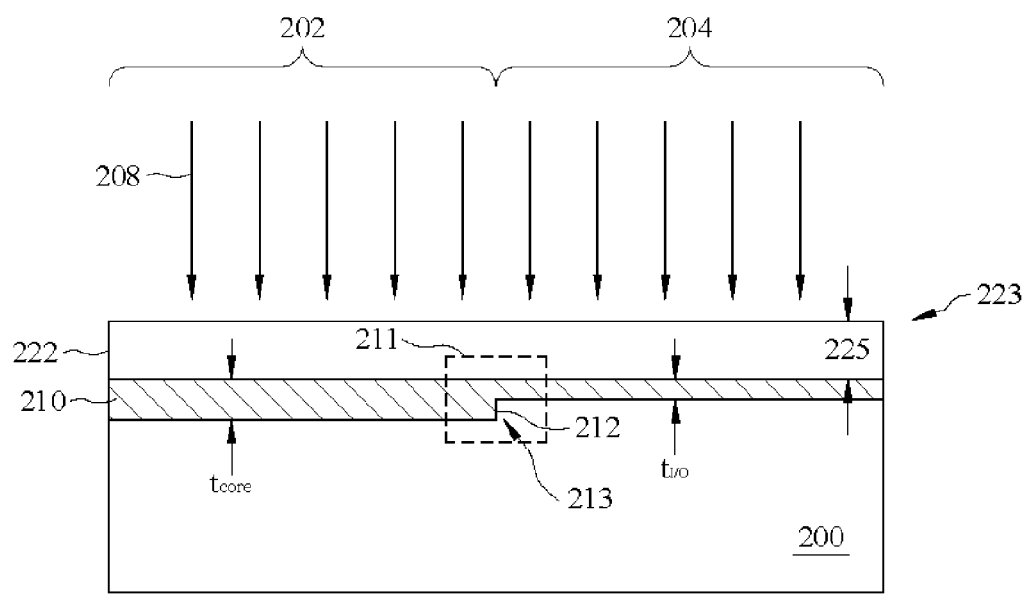

Referring to FIG. 2c, the mask 206 is stripped and dielectric material 208, preferably oxygen, is again implanted into the core region 202 and the I/O region 204 of the silicon substrate 200. The second oxygen implantation step extends the buried dielectric 210 into the I/O region 204 of the silicon substrate 200 and thickens the buried dielectric 210 in the core region 202. The thickness $t_{core}$ of the buried dielectric 210 in the core region 202 is preferably about 1000 angstroms. The thickness of the buried dielectric 210 in the I/O region 204 $t_{I/O}$ is preferably about 300 angstroms. The thickness of the buried dielectric may alternatively range between about 50 angstroms and about 2000 angstroms.

After implantation, the SIMOX process includes a high temperature (e.g., about 1300 degrees Celsius) anneal of the substrate. In other illustrative embodiments, the steps of masking and buried dielectric implantation are repeated any number of times, forming a buried dielectric of any number of thicknesses in any number of regions on the wafer.

The buried dielectric 210 isolates a semiconductor layer 222 from the wafer substrate 200. The wafer 223, comprising silicon 222 over an insulator 210, is conventionally referred to as a silicon-on-insulator (SOD) wafer. The semiconductor layer 222 commonly has a thickness 225 of about 200 angstroms. However, the thickness 225 may range between about 50 angstroms and about 500 angstroms.

Figure 2D:
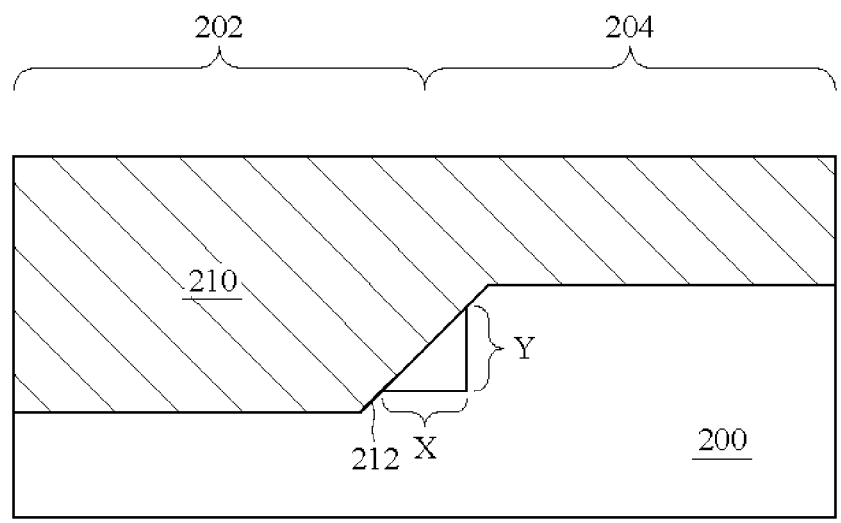
FIG. 2d shows a cross-sectional view of a buried dielectric step.

Although a buried dielectric step 215 in the dashed box 211 is shown with right angles, the step 211 preferably has a sloped sidewall 212, as shown in FIG. 2d. FIG. 2d is an enlarged view of the dashed box 211. The slope of the sidewall 212 is a thickness gradient, which is dependent on circuit design. For example, the gradient region may be a forbidden region for active devices but dummy devices or passive devices may be formed therein. This is because the gradient region may contain dislocations and a non-uniform capacitance, which may result in unstable electric performance of active devices. In illustrative embodiments, steps in the buried oxide may have different thickness gradients, however, each thickness gradient (in the vertical direction) preferably ranges between about 50 angstroms and about 200 angstroms. In some instances, a small spacing (less than about 0.3 um) may be desired between two active regions, one with a thin barrier dielectric and another with a thick barrier dielectric. In those instances, the step may be preferably no greater than about 1/10 of the spacing to avoid the threshold voltage fluctuation due to a closed active region.

Figure 2E:
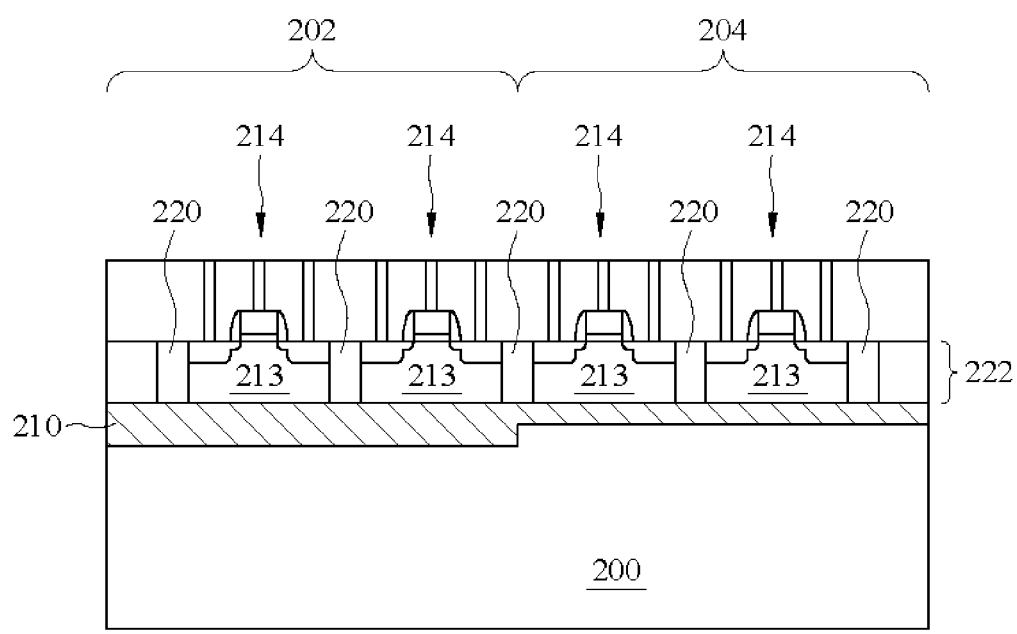
FIG. 2e shows a first illustrative embodiment of the present invention.

Subsequent manufacturing steps form the first illustrative embodiment shown in FIG. 2e. Shallow trench isolation structures 220 isolate FD SOI transistors 214. The transistors 214 over the thicker portion of the buried dielectric 210 in the core region 202 will have a lower threshold voltage than the transistors 214 over the thinner portion of the buried dielectric 210 in the I/O region 204.

Varying the thickness of the buried dielectric 210 in different regions 202 and 204 of the same substrate 200 provides substantial control of the voltage threshold of the FD SOI devices 214. For each transistor 214, the underlying buried dielectric 210 acts as a capacitor dielectric between the anode, represented by the well or body region 213, and the cathode, represented by the substrate 200 underlying the buried dielectric 210, respectively. Varying the buried dielectric 210 thickness varies the capacitance tied to the transistor channel region in the well region 213, thereby providing a different voltage threshold to the FD SOI devices 214 according to region 202 or 204.

An FD SOI device 214 in the I/O region 204 has a higher possible $V_{th}$ than a substantially similar device 214 in the core region 202 because of the difference in buried dielectric 210 thickness. In general, a thinner buried dielectric will provide a larger $V_{th}$ tuning range, and a thicker buried dielectric will provide a smaller $V_{th}$ tuning range.

In other illustrative embodiments, variation of the buried dielectric thickness is not limited to variation by region. The buried dielectric thickness may be varied on a chip or a wafer as desired for any number of areas having any number of sizes. Although the buried dielectric thickness is preferably varied in accordance with voltage threshold requirements for FD SOI devices, the buried dielectric thickness may alternatively be varied in accordance with other application requirements relating to semiconductor device operation, such as temperature (e.g., SOI self heating effect), current, and noise, for example.

Ion implantation steps that form the n-type or p-type well regions 213 in the semiconductor material 222 overlying the buried dielectric 210 may produce phosphorus or boron doped silicon oxide in top regions of the buried dielectric 210. The diffusion of III-V type impurities into the buried dielectric 210 from overlying well regions 213 may also contribute to doped silicon oxide in regions of the buried dielectric 210.

Figure 2F:
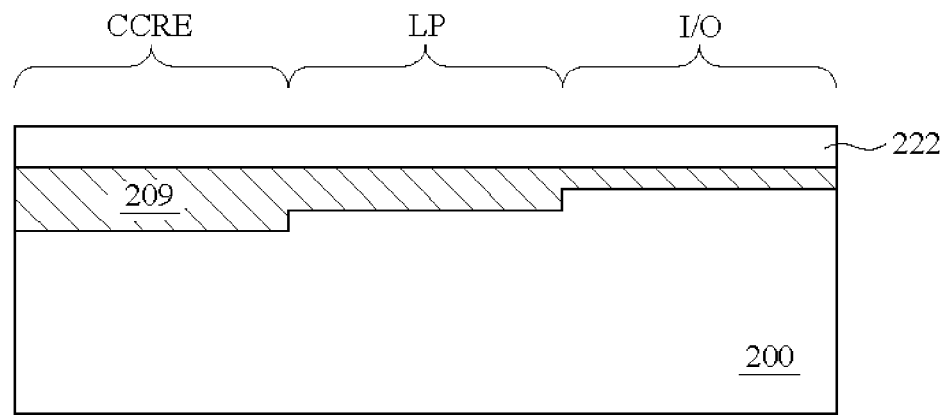
FIG. 2f shows a second illustrative embodiment of the present invention.

A second illustrative embodiment shown in FIG. 2f shows more than two buried dielectric 209 thicknesses for regions CORE, LP, and I/O on the same wafer substrate 200. The FD SOI transistors subsequently formed in the silicon substrate 222 over the buried dielectric 209 will have different $V_{th}$ in accordance with the underlying thickness of the buried dielectric 209. Preferably, FD SOI transistors formed overlying the thickest portion of the buried dielectric 209 will have a lower $V_{th}$ than FD SOI transistors formed in the LP region or the I/O region. FD SOI transistors formed in the LP region will have a higher $V_{th}$ than the transistors formed in the CORE region. The FD SOI transistors formed in the I/O region will have a higher $V_{th}$ than the transistors in the LP region and the CORE region.

Figure 3A:
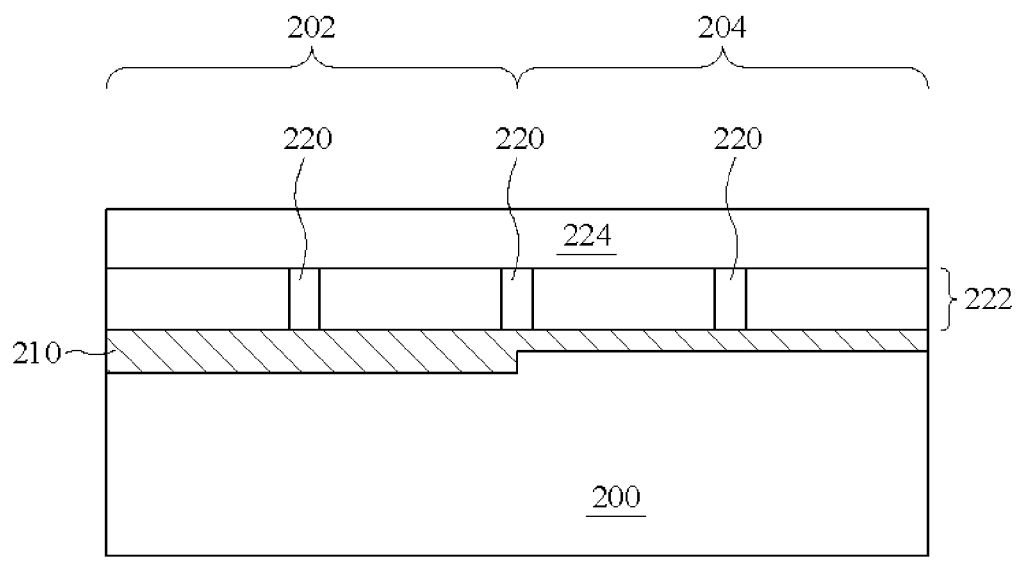
FIGS. 3a-3h show cross-sectional views demonstrating steps of a second method of manufacturing in accordance with a third illustrative embodiment of the present invention.

A second method in accordance with a third illustrative embodiment, shown in FIGS. 3a-3h, comprises the buried dielectric 210 of the first illustrative embodiment. In FIG. 3a, shallow trench isolation structures 220 are formed in the silicon region 222 overlying the buried dielectric 210. Alternatively, other isolation structures (e.g., mesa isolation and LOCOS isolation) may be used. The silicon region 222 over the buried dielectric 210 is about 200 angstroms thick.

A gate dielectric 224 comprising silicon oxide is deposited. The thickness of the gate dielectric 224 is about 100 angstroms and may alternatively range between about 20 angstroms and about 100 angstroms. The gate dielectric may alternatively be formed of a high k dielectric material having a high dielectric constant, greater than about 4.0. The high k dielectric material may be a metal dielectric, including metal oxide such as $Al_2O_3$, $Ta_2O_5$, $ZrO_2$, and $HfO_2$, or HfSi for example. Various kinds of treatment can be used on high k dielectrics such as $NH_3$ anneal, $O^+$ anneal, NO anneal, and $N_2O$ anneal, all well known.

Figure 3B:
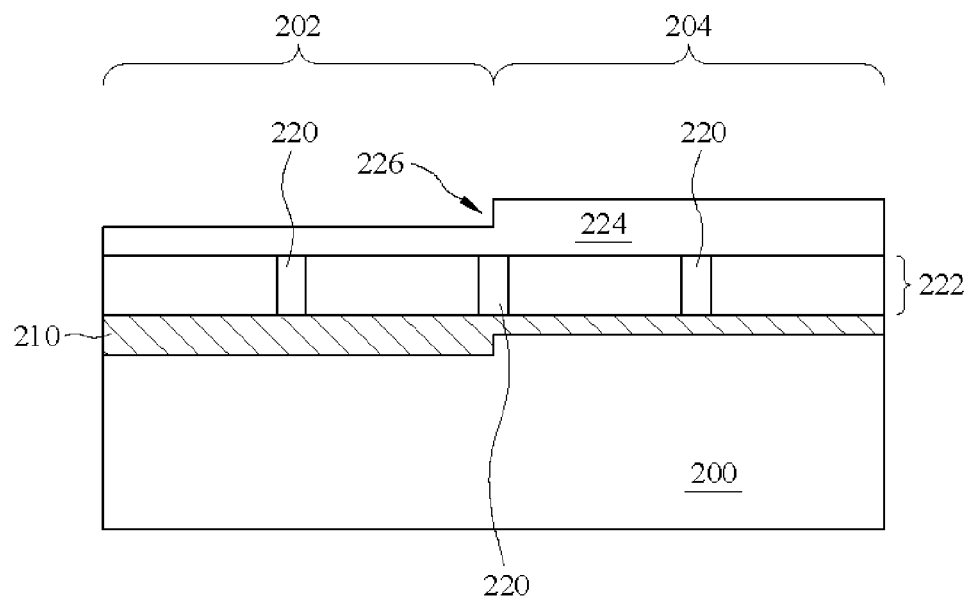

A mask material such as a photoresist (not shown), covers the gate dielectric 224 in the I/O region 204, and a portion of the exposed gate dielectric 224 in the core region 202 is removed, as shown in FIG. 3b. The resulting thickness of the gate dielectric 224 in the core region 202 is about 8 angstroms and may alternatively range between about 8 angstroms and about 20 angstroms. For emphasis, the step 226 formed between the core region 202 and the I/O region 204 is shown on a larger scale.

The thicker portion of the gate dielectric 224 will enable a higher voltage threshold in the FD SOI devices that will subsequently be formed in the I/O region 204. In contrast, the FD SOI devices to be formed in the core region 202 will have a thinner gate dielectric 224 and a corresponding lower voltage threshold.

Figure 3C:
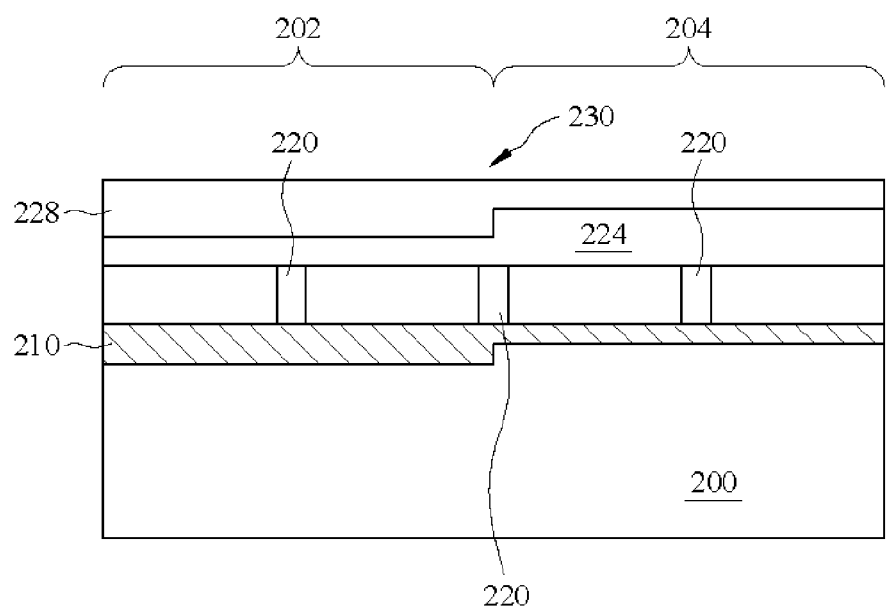

A layer of polysilicon 228 is deposited on the gate dielectric 224 as shown in FIG. 3c. Although, a polysilicon step (not shown) may form over the gate dielectric step 226 in the polysilicon surface 230, the polysilicon step is a relatively insignificant surface feature and the polysilicon surface 230 is represented in FIG. 3c as being substantially planar for illustrative purposes.

Figure 3D:
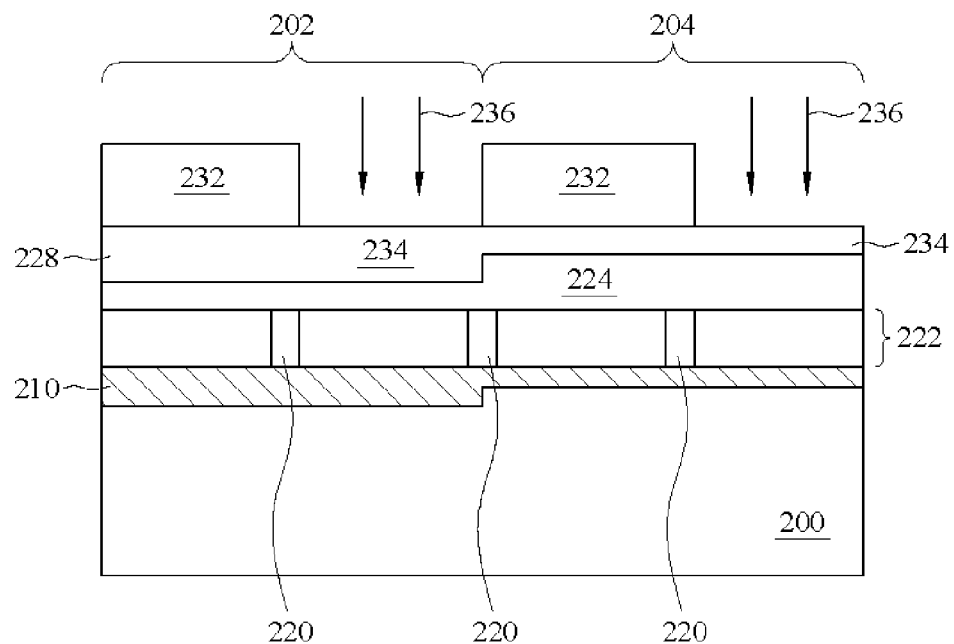

FIG. 3d shows subsequent steps of forming a photoresist material 232 on the polysilicon 228. Unmasked portions 234 of the polysilicon 228 are doped 236 with an n-type dopant, forming n-doped polysilicon region 234. The dopant is preferably implanted by known ion implantation methods such as plasma immersion ion implantation (PIII) or metal plasma immersion ion implantation (MePIII), for example. The dopant is preferably phosphorus and may alternatively be arsenic, boron, mescaline ($BF_2$), hydrogen, nitrogen, oxygen, argon, or combinations thereof.

Figure 3E:
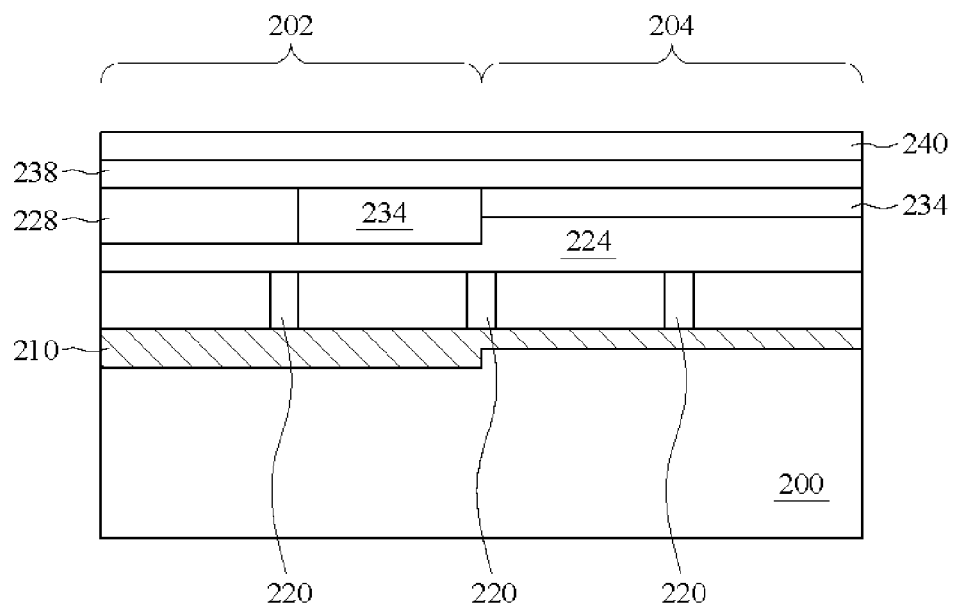

As shown in FIG. 3e, a first metal layer 238 and a second metal layer 240 are consecutively deposited over the gate dielectric 224. The thickness of the first metal layer 238 is about 50 angstroms and the thickness of the second metal layer 240 is about 200 angstroms. The metal layers 238 and 240 are deposited using known deposition methods such as evaporation, sputtering, or various types of chemical vapor deposition such as plasma enhanced chemical vapor deposition, for example. The first metal layer 238 preferably comprises titanium and the second metal layer 240 preferably comprises platinum. However, the first 238 and second 240 metal layers may alternatively comprise nickel, palladium, platinum, iridium, ruthenium, rhodium, molybdenum, hafnium, aluminum, cobalt, tungsten, or combinations thereof, for example. Combinations may include metal alloys such as binary metal alloys, metal silicides, metal silicon nitrides, doped metal alloys, and doped silicide alloys, for example.

Figure 3F:
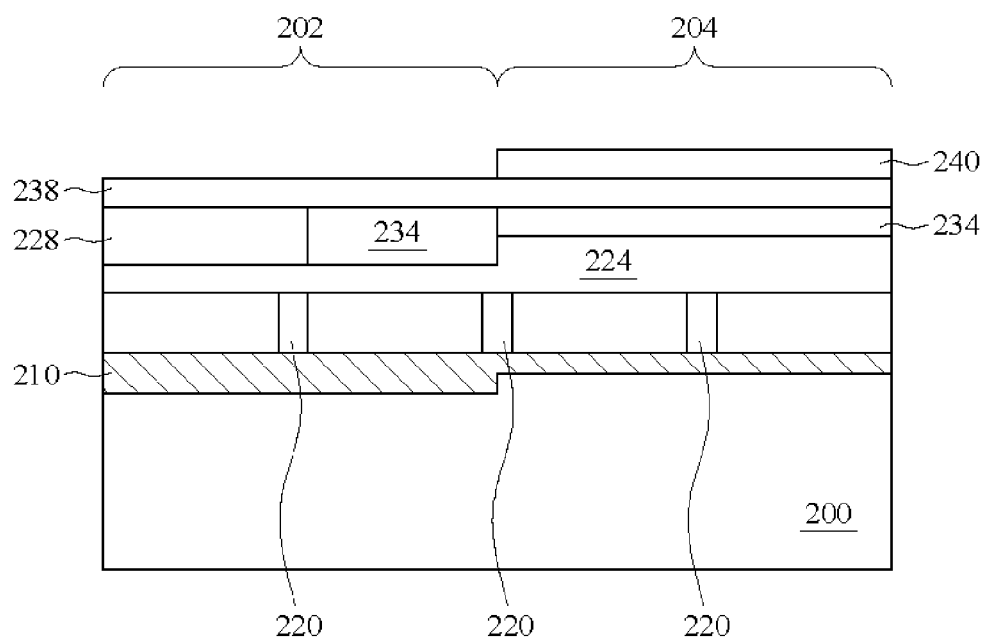

Subsequent photolithography steps mask a portion of the second metal layer 240 in the I/O region 204, and the exposed portion of the second metal layer 240 in the core region 202 is removed, as shown in FIG. 3f. A wet etch or reactive ion etching may be used to remove portions of the second metal layer 240.

Figure 3G:
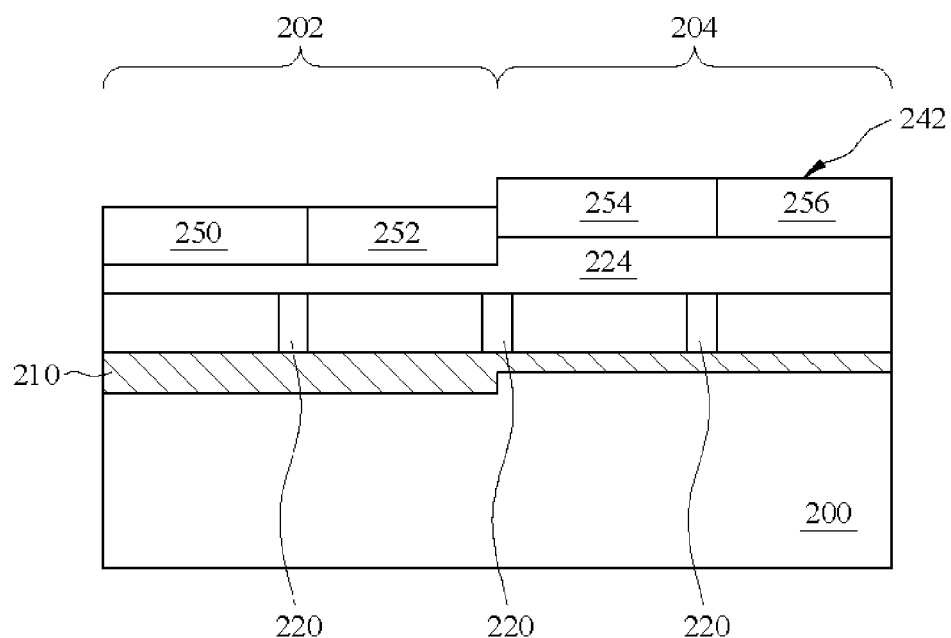

A thermal anneal at about 500° C. for about 10 minutes causes the metals 238 and 240 to diffuse into the undoped 228 and doped 234 regions of the polysilicon, as shown in FIG. 3g. The anneal process produces a silicon titanium alloy gate electrode 250 and an n-doped silicon titanium alloy gate electrode 252 in the core region 202. The anneal process also produces a titanium, platinum and silicon alloy 254 and an n-doped titanium, platinum and silicon alloy 256 in the I/O region 204. In the illustrated embodiments, only a single gate electrode doping step is illustrated. One skilled in the art will recognize, however, that the gate electrodes can have differing doping concentrations and differing doping impurities. This can be accomplished, e.g., by multiple doping steps and by in-situ doping during deposition of gate polysilicon layer 228. Preferably, the ratio of doping concentration between the gate electrodes is in the order of $10^5$ or less.

Figure 3H:
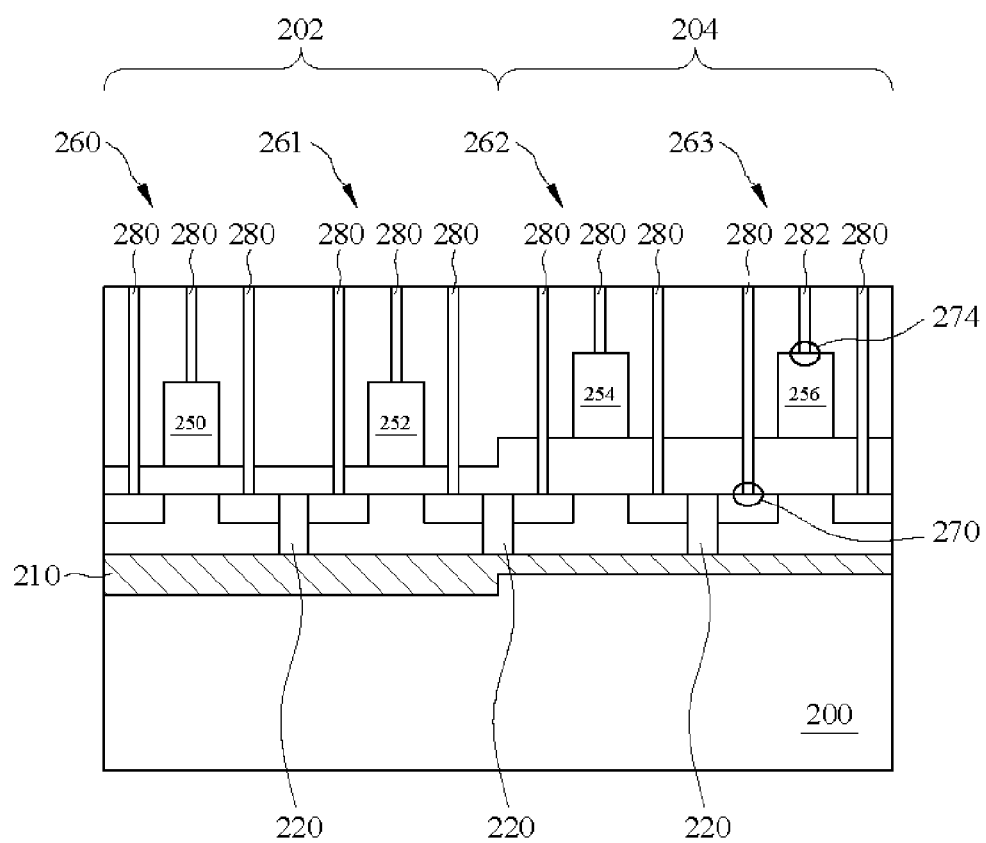

FIG. 3h shows the structure of FIG. 3g after further processing produces FD SOI PMOS transistors 260, 261 and FD SOI NMOS transistors 262, 263. Varying the material composition, and thereby the work function of the gate electrodes 250, 252, 254, and 256, provides a corresponding difference in voltage threshold between the FD SOI devices 260, 261, 262, and 263. The voltage thresholds of the FD SOI transistors 260, 261, 262, and 263 in FIG. 3h are partially controlled by the work function of the gate electrodes 250, 252, 254, and 256. The gate electrode 250 has a work function ranging between about 4.7 eV and about 5.0 eV. The gate electrode 254 has a work function ranging between about 4.4 eV and about 4.7 eV. The gate electrode 252 has a work function ranging between about 4.2 eV and about 4.5 eV. The gate electrode 256 has a work function ranging between about 4.5 eV and about 4.8 eV.

The combination of buried dielectric 210 thickness variation, gate dielectric 224 thickness variation, and the variation of gate electrode 250, 252, 254, and 256 work functions, provides a high degree of control of the voltage threshold variation of the FD SOI transistors 260, 261, 262, and 263 and other devices on the same chip die 200 or in the same wafer.

The FD SOI transistors 260, 261, 262, 263 used in the illustrative embodiments described herein are meant to be illustrative of depleted substrate devices in general. The present invention may also be applied to partially depleted devices such as partially depleted silicon-on-insulator (PD SOI) transistors, for example. Other devices in illustrative embodiments of the present invention include field effect transistors (FET) such as metal oxide semiconductor FETs (MOSFETs), metal semiconductor FETs (MESFETs), thin film transistors (TFTs), strained channel transistors, and double gate MOSFETs, for example. Although the present invention is suitable for any technology node, the present invention is preferably suitable for the 65 nm node and smaller technology nodes.

Contacts 280, such as those coupled at the source 270, drain 272 and gate 274 regions of the transistor 263, for example, alter or otherwise form new work functions in the transistors. For example, silicide formed in the source region 270 of the FD SOI NMOS 263, provides a fifth work function in the source region as a result of the diffusion of the tungsten material in the contact 280 with the doped polysilicon in the top portion of source region 270. Another gate work function is provided by diffusion of the tungsten material in the contact 282 with the n-doped polysilicon and titanium of the gate electrode 256 in the top portion of the gate electrode 274.

The preferred embodiments of the present invention provide a significant advantage relating to the control of the voltage threshold of semiconductor devices, and specifically to fully depleted silicon-on-insulator devices in different circuit applications on a chip. The present invention may be used to include devices requiring thin and ultra-thin buried oxides on a single die, for example. Applications include core applications, low power applications, and I/O applications, for example. Improved control of the voltage threshold of devices in different applications provides more control of the drain induced barrier lowering in FD SOI devices, and enhanced device and circuit performance.

An advantage of the preferred embodiments of the present invention is that the buried dielectric thickness may be varied according to applications having transistors with different desired voltage thresholds, e.g., core applications, low power applications, and I/O applications. Another advantage is that different buried oxide thicknesses in the same wafer may be used to provide $V_{th}$ adjustment substantially reserved for FD SOI back-gate biased devices requiring $V_{th}$ adjustment, e.g., core applications, low power applications, and I/O applications.

Although preferred embodiments of the present invention and their advantages have been described in detail, it should be understood that various changes, substitutions and alterations can be made herein without departing from the spirit and scope of the invention as defined by the appended claims. For example, it will be readily understood by those skilled in the art that a fully depleted SOI multiple threshold voltage application may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently, existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a first mask over a first region of a semiconductor substrate;
   implanting a first material into a second region of the semiconductor substrate;
   removing the first mask;
   implanting a second material into the first region and into the second region of the semiconductor substrate, the implanting steps forming a buried dielectric material in the semiconductor substrate, the buried dielectric material having a first thickness in the first region and a second thickness in the second region, the buried dielectric material having a step transitioning from the first thickness to the second thickness;
   annealing the semiconductor substrate;
   forming a shallow trench isolation structure in the semiconductor substrate overlying the buried dielectric material and aligned over the step; and
   forming a first transistor in the first region and aligned over the buried dielectric material with the first thickness and a second transistor in the second region and aligned over the buried dielectric material with the second thickness, the shallow trench isolation structure disposed between the first transistor and the second transistor, the forming the first transistor and the second transistor comprising:
   forming a gate dielectric material over the first and second regions; and
   removing only a portion of the gate dielectric material in the second region, the gate dielectric material thereby having a third thickness in the first region and a fourth thickness in the second region;
   wherein the step in the buried dielectric transitioning from the first thickness and the second thickness is disposed between the first transistor and the second transistor.

2. The method of claim 1, wherein the first and second materials are coterminous.

3. The method of claim 1, wherein the semiconductor substrate comprises silicon and the buried dielectric material comprises an oxide.

4. The method of claim 1, wherein the step is disposed between a first edge of the shallow trench isolation structure and a second edge of the shallow trench isolation structure.

5. The method of claim 1, wherein the first region of the buried dielectric material has a top surface that is substantially level with a top surface of the second region of the buried dielectric material.

6. The method of claim 1, wherein the buried dielectric region further comprises a third region, the third region having a fifth thickness different than the first thickness and the second thickness.

7. A method comprising:
   forming a first mask over a first region of a semiconductor substrate;
   implanting a first material into a second region of the semiconductor substrate;
   removing the first mask;
   implanting a second material into the first region and into the second region of the semiconductor substrate, the implanting steps forming a buried dielectric material in the semiconductor substrate, the buried dielectric material having a first thickness in the first region and a second thickness in the second region;
   annealing the semiconductor substrate;
   forming a gate dielectric material over the first and second regions;
   depositing a polysilicon material over the gate dielectric material;
   substantially planarizing a top surface of the polysilicon material;
   implanting a first material into the polysilicon material in a first portion of the first region and implanting a second material into a first portion of the second region;
   depositing a first metal over the polysilicon material;
   depositing a second metal over the first metal;
   substantially removing the second metal in the second region; and
   performing a thermal anneal.

8. The method of claim 7, wherein the first material and the second material are substantially coterminous.

9. The method of claim 7, wherein the thermal anneal is performed in a furnace at a temperature of about 500 degrees centigrade for about 10 minutes, thereby forming a first polysilicon metal alloy in the first portion of the first region, a second polysilicon metal alloy in a second portion of the first region, a third polysilicon metal alloy in the first portion of the second region, and a fourth polysilicon metal alloy in a second portion of the second region.

10. The method of claim 9, further comprising the steps of:
selectively removing portions of the polysilicon metal alloys and the underlying gate dielectric material, thereby forming:
a first gate electrode with a first work function in the first polysilicon metal alloy;
a second gate electrode with a second work function in the second polysilicon metal alloy;
a third gate electrode with a third work function in the third polysilicon metal alloy; and
a fourth gate electrode with a fourth work function in the fourth polysilicon metal alloy; and
forming source and drain regions on oppositely adjacent sides of the gate electrodes.

11. The method of claim 10, further comprising the steps of:
forming a first silicide in a portion of a first source region with a third metal, the first silicide thereby having a fifth work function; and
forming a second silicide in a portion of the first gate electrode with a fourth metal, the second silicide thereby having a sixth work function.

12. A method comprising:
implanting a first material in a first region of a semiconductor substrate;
implanting a second material in the first region and a second region of the semiconductor substrate;
annealing the semiconductor substrate, wherein a combination of the first material and the second material in the first region has a different dielectric property than the second material in the second region, wherein a thickness of the semiconductor substrate above the first material and the second material in the first region is about the same as a thickness of the semiconductor substrate above the second material in the second region; and
forming a shallow trench isolation structure in the semiconductor substrate and aligned over a transition between the first material and second material in the first region and the second material in the second region.

13. The method of claim 12, further comprising, before the annealing, implanting a third material in a portion of the first region, wherein a combination of the first material, the second material, and the third material has a different dielectric property than the combination of the first material and the second material.

14. The method of claim 13, wherein regions implanted with the first material, the second material, and the third material form a continuous dielectric region.

15. The method of claim 12, wherein the semiconductor substrate comprises silicon and the first material forms an oxide.

16. A method comprising:
providing a substrate;
forming a dielectric region below a surface of the substrate, the dielectric region having a first region and a second region with a top surface of the second region substantially level with a top surface of the first region, the first region and the second region having a different thickness and transitioning in a transition region from the first region to the second region via a thickness gradient, the forming being performed at least in part by implanting, the first region and the second region being positioned at a first depth below a surface of the substrate;
forming a shallow trench isolation structure in the substrate and aligned directly over the transition region; and
forming a first gate stack over the first region and a second gate stack over the second region, the shallow trench isolation structure disposed between the first gate stack and the second gate stack;
wherein the dielectric region further comprises a third region, the third region having a different thickness than the first region and the second region.

17. The method of claim 16, wherein the forming is performed at least in part by annealing.

18. The method of claim 16, wherein the first gate stack has a first gate dielectric and the second gate stack has a second gate dielectric, the first gate dielectric having a different thickness than the second gate dielectric.

19. A method comprising:
providing a substrate;
forming a dielectric region below a surface of the substrate, the dielectric region having a first region and a second region, the first region and the second region having a different thickness, the forming being performed at least in part by implanting; and
forming a first gate stack over the first region and a second gate stack over the second region, the first gate stack having a first gate dielectric and the second gate stack having a second gate dielectric, the first gate dielectric having a different thickness than the second gate dielectric, wherein the forming the first gate stack over the first region and the second gate stack over the second region comprises:
depositing a polysilicon layer over a gate dielectric layer;
depositing a first metal over the polysilicon layer;
depositing a second metal over the first metal;
substantially removing the second metal in the second region; and
performing an anneal.

20. The method of claim 19, further comprising forming a shallow trench isolation structure in the substrate and aligned directly over a transition between the first region and the second region.

* * * * *